(12) United States Patent
Chen

(10) Patent No.: US 8,059,200 B2
(45) Date of Patent: Nov. 15, 2011

(54) VIDEO CLOCK GENERATOR FOR MULTIPLE VIDEO FORMATS

(75) Inventor: Dongwei Chen, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 884 days.

(21) Appl. No.: 12/102,220

(22) Filed: Apr. 14, 2008

(65) Prior Publication Data

US 2009/0256961 A1    Oct. 15, 2009

(51) Int. Cl.
*H03L 7/00* (2006.01)

(52) U.S. Cl. ........ 348/536; 348/547; 348/537; 348/540; 348/552; 345/519; 345/1.1

(58) Field of Classification Search .......... 348/536, 348/522, 537, 540, 547, 552; 345/519, 1.1
See application file for complete search history.

(56) References Cited

U.S. PATENT DOCUMENTS

| 6,034,735 | A | 3/2000 | Senbongi et al. | |
|---|---|---|---|---|
| 7,042,296 | B2 * | 5/2006 | Hui et al. | 331/17 |
| 2002/0085120 | A1 | 7/2002 | Yamaguchi et al. | |
| 2002/0163391 | A1 * | 11/2002 | Peterzell | 331/25 |
| 2003/0040292 | A1 * | 2/2003 | Peterzell et al. | 455/147 |
| 2004/0012578 | A1 | 1/2004 | Naegle | |
| 2006/0158266 | A1 * | 7/2006 | Yonekawa et al. | 331/17 |

OTHER PUBLICATIONS

Lattice Semiconductor Corporation, "SMPTE SDI Demo User's Guide", Nov. 2007, pp. 1-23.
Gennum, GS4911B/GS4910B Data Sheet, "GS4911B/GS4910B HD/SD/ Graphics Clock and Timing Generator with GENLOCK", Apr. 2007, pp. 1-113.
International Search Report corresponding to International Application No. PCT/US2009/039605, Korean Intellectual Property Office, dated Jun. 29, 2009, 3 pages.
Written Opinion corresponding to International Application No. PCT/US2009/039605, Korean Intellectual Property Office, dated Jun. 29, 2009, 4 pages.

* cited by examiner

*Primary Examiner* — Brian Yenke
*Assistant Examiner* — Mustafizur Rahman
(74) *Attorney, Agent, or Firm* — Vedder Price P.C.

(57) ABSTRACT

An integrated video clock signal generator in which a master phase-locked loop (PLL) control circuit uses an off-chip voltage-controlled oscillator (VCO) to produce an on-chip oscillator signal in synchronization with a horizontal reference signal related to a horizontal video synchronization signal. This on-chip oscillator signal drives one or more slave PLL circuits which provide respective one or more on-chip PLL signals synchronized with the on-chip oscillator signal. In accordance with a preferred embodiment, each on-chip PLL signal is a pixel clock signal with a plurality of clock signal pulses which is synchronized with a vertical reference signal related to a vertical video synchronization signal.

15 Claims, 6 Drawing Sheets

VIDEO CLOCK GENERATOR FOR MULTIPLE VIDEO FORMATS

BACKGROUND

1. Field of the Invention

The present invention relates to clock generator circuits, and in particular, to clock generator circuits for generating video clock signals.

2. Related Art

In recent years, sources of and uses for video image data have increased dramatically. As a result, it has become increasingly important for video image systems to be capable of processing (e.g., capturing, converting, editing and displaying) video image information in accordance with a number of different formats. Further, concurrent with increases in sophistication of such systems have been advances in miniaturization. Accordingly, it has become increasingly desirable to have a single-chip solution for providing video interface and clock signals to support multiple formats.

SUMMARY

In accordance with the presently claimed invention, an integrated video clock signal generator is provided in which a master phase-locked loop (PLL) control circuit uses an off-chip voltage-controlled oscillator (VCO) to produce an on-chip oscillator signal in synchronization with a horizontal reference signal related to a horizontal video synchronization signal. This on-chip oscillator signal drives one or more slave PLL circuits which provide respective one or more on-chip PLL signals synchronized with the on-chip oscillator signal. In accordance with a preferred embodiment, each on-chip PLL signal is a pixel clock signal with a plurality of clock signal pulses which is synchronized with a vertical reference signal related to a vertical video synchronization signal.

In accordance with one embodiment of the presently claimed invention, integrated video clock signal generator circuitry includes:

a first electrode to convey an off-chip control signal for off-chip voltage-controlled oscillator (VCO) circuitry;

a second electrode to convey an off-chip VCO signal from the off-chip VCO circuitry;

master phase detection circuitry coupled to the first and second electrodes and responsive to a horizontal reference signal and the off-chip VCO signal by providing the off-chip control signal, wherein the horizontal reference signal is related to a horizontal video synchronization signal, and the off-chip VCO signal is synchronized with the horizontal reference signal; and slave phase-locked loop (PLL) circuitry coupled to the second electrode and responsive to the off-chip VCO signal by providing one or more on-chip PLL signals, wherein each of the one or more on-chip PLL signals is synchronized with the off-chip VCO signal.

In accordance with another embodiment of the presently claimed invention, integrated video clock signal generator circuitry includes:

master phase detector means for receiving a horizontal reference signal and an off-chip voltage-controlled oscillator (VCO) signal from off-chip VCO circuitry, and in response thereto providing an off-chip control signal for the off-chip VCO circuitry, wherein the horizontal reference signal is related to a horizontal video synchronization signal, and the off-chip VCO signal is synchronized with the horizontal reference signal; and slave phase-locked loop (PLL) means for receiving the off-chip VCO signal and in response thereto providing one or more on-chip PLL signals, wherein each of the one or more on-chip PLL signals is synchronized with the off-chip VCO signal.

In accordance with still another embodiment of the presently claimed invention, a method for generating one or more video clock signals with an integrated circuit includes:

receiving, on-chip, a horizontal reference signal and an off-chip voltage-controlled oscillator (VCO) signal from off-chip VCO circuitry, and in response thereto providing an off-chip control signal for the off-chip VCO circuitry, wherein the horizontal reference signal is related to a horizontal video synchronization signal, and the off-chip VCO signal is synchronized with the horizontal reference signal; and receiving, on-chip, the off-chip VCO signal and in response thereto providing one or more on-chip PLL signals, wherein each of the one or more on-chip PLL signals is synchronized with the off-chip VCO signal.

DETAILED DESCRIPTION

Figure 1:
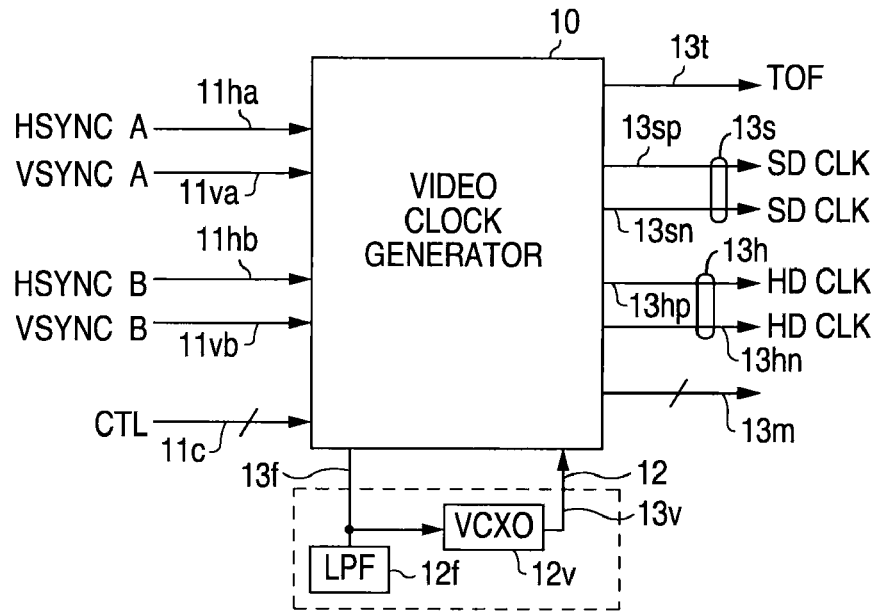
FIG. 1 identifies input and output signals of a video clock generator in accordance with one embodiment of the presently claimed invention.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

A video clock generator in accordance with the presently claimed invention provides multiple video clock signals having different clock rates. Such a clock generator can be advantageously used in a wide range of video applications, including video genlock, SDI serializers and deserializers, video capture, video conversion, video editing, video displays, and other broadcast and professional video systems.

As discussed in more detail below, a video clock generator in accordance with the presently claimed invention can provide multiple standard definition (SD) and high definition (HD) clock signals, and a programmable top-of-frame timing pulse. In a genlock mode of operation, these output signals can be phase-locked to horizontal and vertical synchronization signals applied to either of two multiplexed inputs.

An external, inexpensive, voltage-controlled crystal oscillator (VCXO, e.g., at 27.0000 megahertz) can be used to operate this video clock generator for any mode of operation. This avoids any need for discrete or field programmable gate array (FPGA) PLLs with multiple VCXOs, while providing output clocks signals with minimal clock jitter. (Additional information on a commercial product embodying a video clock generator in accordance with the presently claimed invention can be found in a preliminary data sheet dated Feb. 28, 2008, and a preliminary application note dated Jan. 28, 2008, filed herewith as Appendices A and B, respectively, for commercial part LMH1982 by the assignee, National Semiconductor Corporation.)

Referring to FIG. 1, a video clock generator 10 in accordance with one embodiment of the presently claimed invention receives two sets of horizontal 11ha, 11hb and vertical 11va, 11vb synchronization signals. These synchronization signals 11ha, 11va, 11hb, 11vb can be obtained by stripping the horizontal and vertical synchronization information from video signals in accordance with well known principles. A number of control signals 11c are also received for either controlling the video clock generator 10 directly or providing control data for on-chip storage and later use.

The output signals include a standard definition pixel clock signal 13s, a high definition pixel clock signal 13h, a top-of-frame (TOF) signal 13t, and some additional signals 13m for providing status information or additional control signals for use elsewhere, e.g., within the host system (not shown). In accordance with a preferred embodiment, the clock signals 13s, 13h are provided as differential signals (e.g., low voltage differential signals) having positive 13sp, 13hp and negative 13sn, 13hn signal phases in accordance with well known principles.

An external voltage-controlled oscillator (VCO) assembly 12 having a low pass loop filter 12f and a VCXO 12v provides an oscillator signal 13v for use as a reference signal by the video clock generator 10, which, in turn, provides the oscillator control signal 13f.

Figure 2:
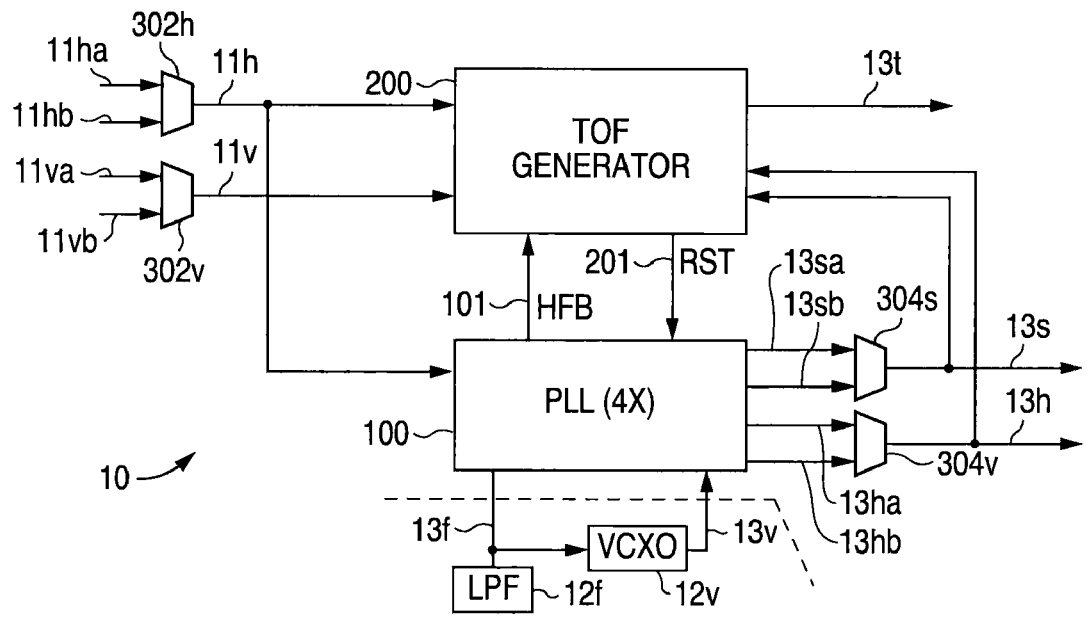
FIG. 2 is a functional block diagram of one example embodiment of the video clock generator of FIG. 1.

Referring to FIG. 2, the video clock generator 10 includes a PLL block 100 (discussed in more detailed below) and a TOF generator 200 (discussed in more detailed below). Also included are input signal multiplexors 302h, 302v to select among the incoming horizontal 11ha, 11hb and vertical 11va, 11vb synchronization signals for routing as the internal horizontal 11h and vertical 11v synchronization signals, and output signal multiplexors 304s, 304h to select among multiple standard definition 13sa, 13sb and high definition 13ha, 13hb pixel clock signals for use as the output standard definition 13s and high definition 13h pixel clock signals. The TOF generator 200 provides the TOF signals 13t while exchanging frequency reference 101 and reset 201 signals with the PLL block 100.

Figure 3A:
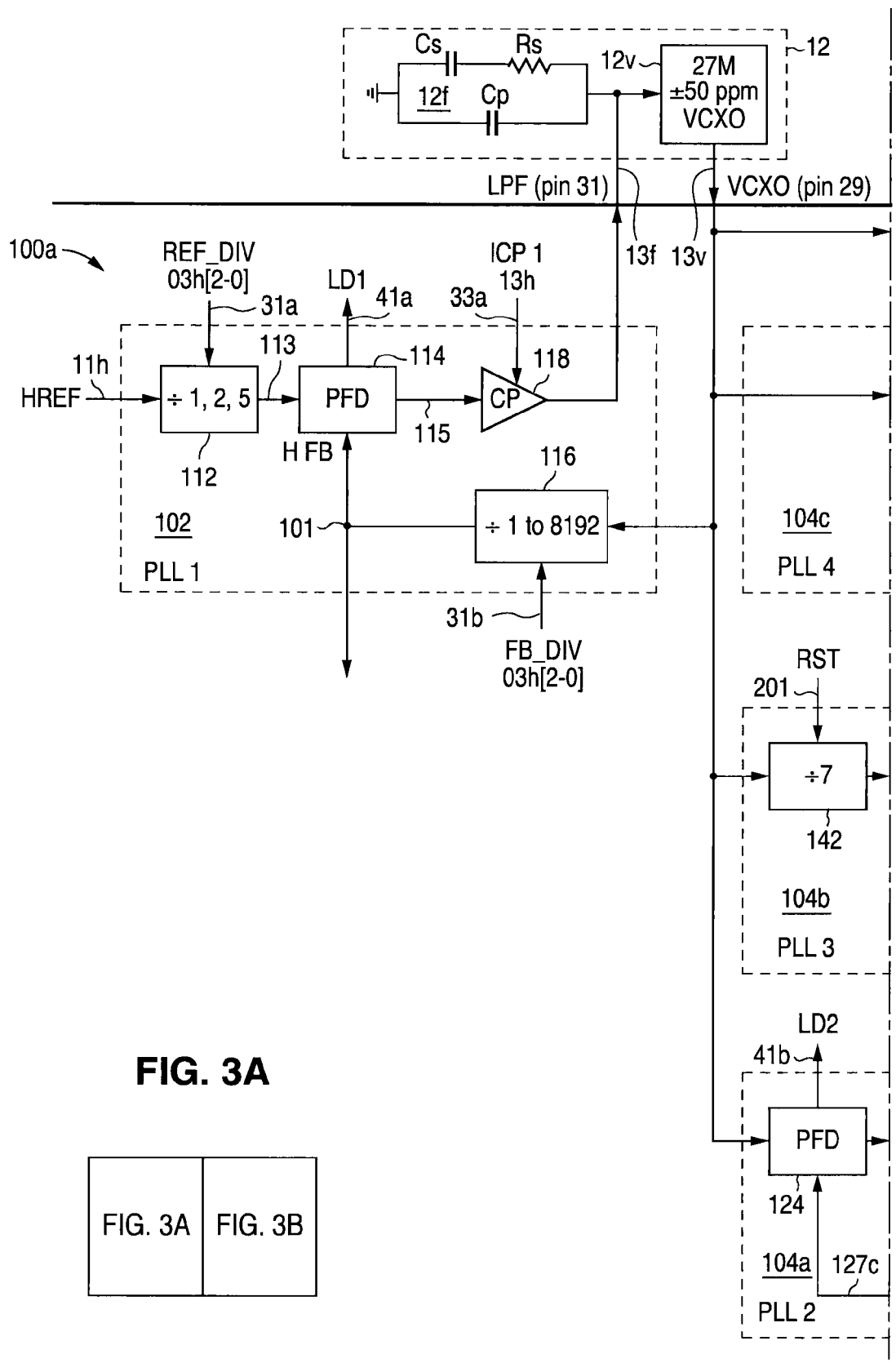
FIG. 3 is a functional block diagram of one example embodiment of the phase-locked loop (PLL) circuitry of FIG. 2.
Figure 3B:
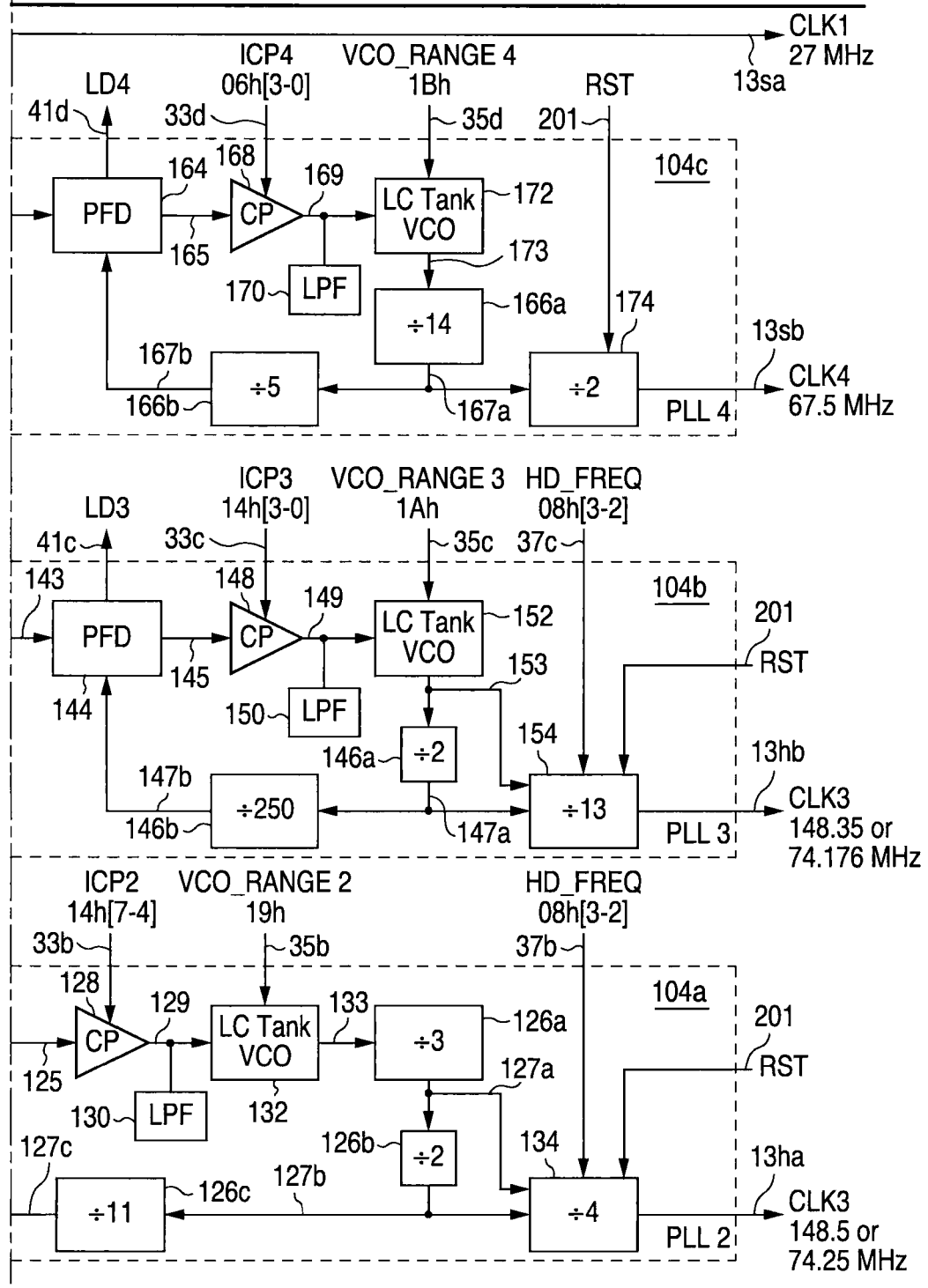

Referring to FIG. 3, the PLL block 100 in accordance with one embodiment 100a of the presently claimed invention includes a master PLL 102 and three slave PLLs 104a, 104b, 104c. The selected horizontal synchronization signal 11h is selectively divided in frequency by a programmable frequency divider 112. The resulting signal 113 is compared in phase and frequency with a feedback signal 101 (which is also provided to the TOF generator 200, as noted above) in a phase-frequency detector (PFD) 114. The detection signal 115 drives a charge pump 118, which provides the off-chip control signal 13f. The off-chip oscillator signal 13v is selectively divided in frequency by a programmable feedback frequency divider 116 to provide the feedback signal 101. Frequency divisor data 31a, 31b are provided as desired to the programmable frequency dividers 112, 116, while charge pump control data 33a can be provided for controlling the charge pump 118 current.

In the first slave PLL 104a, the off-chip oscillator signal 13v is compared in phase and frequency with a final feedback signal 127c in a PFD 124. The detection signal 125 drives a charge pump 128 which provides the control signal 129, filtered by the loop filter 130, for a VCO 132. The oscillator signal 133 is successively divided in frequency by frequency dividers 126a, 126b, 126c to provide the final feedback signal 127c. Intermediate feedback signals 127a, 127b are selected for further frequency division by an output frequency divider 134 which is synchronized with the reset signal 201 (from the TOF generator 200) to produce the first high definition clock signal 13ha. Control data 33b, 35b, 37b can be provided for controlling the charge pump 128 current, the frequency range of the VCO 132 and the frequency of the clock signal 13ha (by selecting which of the intermediate feedback signals 127a, 127b is divided by the output frequency divider 134).

In the second slave PLL 104b, the off-chip oscillator signal 13v is divided by a frequency divider 142, which is synchronized with the reset signal 201. The frequency-divided signal 143 is compared in phase and frequency with a final feedback signal 147b in a PFD 144. The detection signal 145 drives a charge pump 148 which provides the control signal 149, filtered by the loop filter 150, for a VCO 152. The oscillator signal 153 is successively divided by frequency dividers 146a, 146b to provide the final feedback signal 147b. Intermediate feedback signals 146a, 147a are selectively divided in frequency by an output frequency divider 154, which is synchronized with the reset signal 201, to provide another high definition clock signal 13hb. Control data 33c, 35c, 37c can be provided for controlling the charge pump 148 current, the frequency range of the VCO 152 and the output frequency of the clock signal 13hb (by selecting which of the intermediate feedback signals 146a, 147a is divided by the output frequency divider 154).

In the third slave PLL 104c, the off-chip oscillator signal 13v is compared in phase and frequency with a final feedback signal 167b in a PFD 164. The detection signal 165 drives the charge pump 168 which provides the control signal 169, filtered by the loop filter 170, for a VCO 172. The oscillator signal 173 is successively divided in frequency by frequency dividers 166a, 166b. An intermediate feedback signal 167a is divided by an output frequency divider 174, synchronized with the reset signal 201, to provide a standard definition clock signal 13sb. Control data 33d, 35d can be provided for controlling the charge pump 168 current and frequency range of the VCO 172.

Based upon the topologies and interconnections of the master 102 and slave 104a, 104b, 104c PLL circuits, in conjunction with the use an off-chip VCXO assembly 12, the master PLL 102 significantly reduces signal jitter due to jitter that may be present in the incoming horizontal synchronization signal 11h. Each of the slave PLL circuits 104a, 104b, 104c converts this off-chip oscillator signal 13v to the desired output clock signal 13ha, 13hb, 13sb frequency, with the off-chip oscillator signal 13v used directly to provide one of the standard definition clock signal 13sa, while the other standard definition clock signal 13sb is provided by the third slave PLL 104c.

For the high definition clock signals 13ha, 13hb, which are higher in frequency (e.g., 148.5 and 148.35 megahertz), one technique would be to first frequency divide the off-chip oscillator signal 13v and multiply it up in frequency within the PLL circuits 104a, 104b to achieve the desired output frequencies. However, by reducing the input frequency to the PFDs 124, 144, the bandwidths of each PLL104a, 104b would need to be quite narrow to minimize loop noise. For example, if the off-chip oscillator signal 13v has a frequency of 27 megahertz and is divided by a divisor of 91, the input frequency for the PFD 144 would be 296.7 kilohertz, thereby requiring a PLL bandwidth of 14.8 kilohertz for minimal loop noise. With a bandwidth this narrow, the 1/f noise of the on-chip VCO 152 will contribute significantly to the jitter of the clock signal 13hb. Further, when generating such oscillator frequencies on-chip, ring oscillators are often used, and generally with high signal noise.

In accordance with the presently claimed invention, minimum, if any, initial frequency division is used for the off-chip oscillator signal 13v. For example, in the second slave PLL 104b, the oscillator signal 13v is divided in frequency by a low divisor (e.g., by 7), thereby allowing the bandwidth of the PLL 104b to be significantly higher (e.g., 13 times higher, 13*7=91). Additionally, this allows the VCO 152 to operate at nearly two gigahertz (e.g., approximately 1928.5 megahertz), thereby allowing a resonant tank VCO circuit to be used with inductive and capacitive components integrated on-chip. As is well known, resonant tank circuit oscillators provide better noise performance than ring oscillators.

Similarly, the first 104a and third 104c slave PLL circuits also use resonant tank circuit oscillators 132, 172, and operate at nominal frequencies of 1782 and 1890 megahertz respectively.

For each PLL 102, 104a, 104b, 104c, a lock detection status signal 41a, 41b, 41c, 41d can be provided by the PFDs 114, 124, 144, 164 for monitoring the phase-lock status of each PLL 102, 104a, 104b, 104c.

Figure 4:
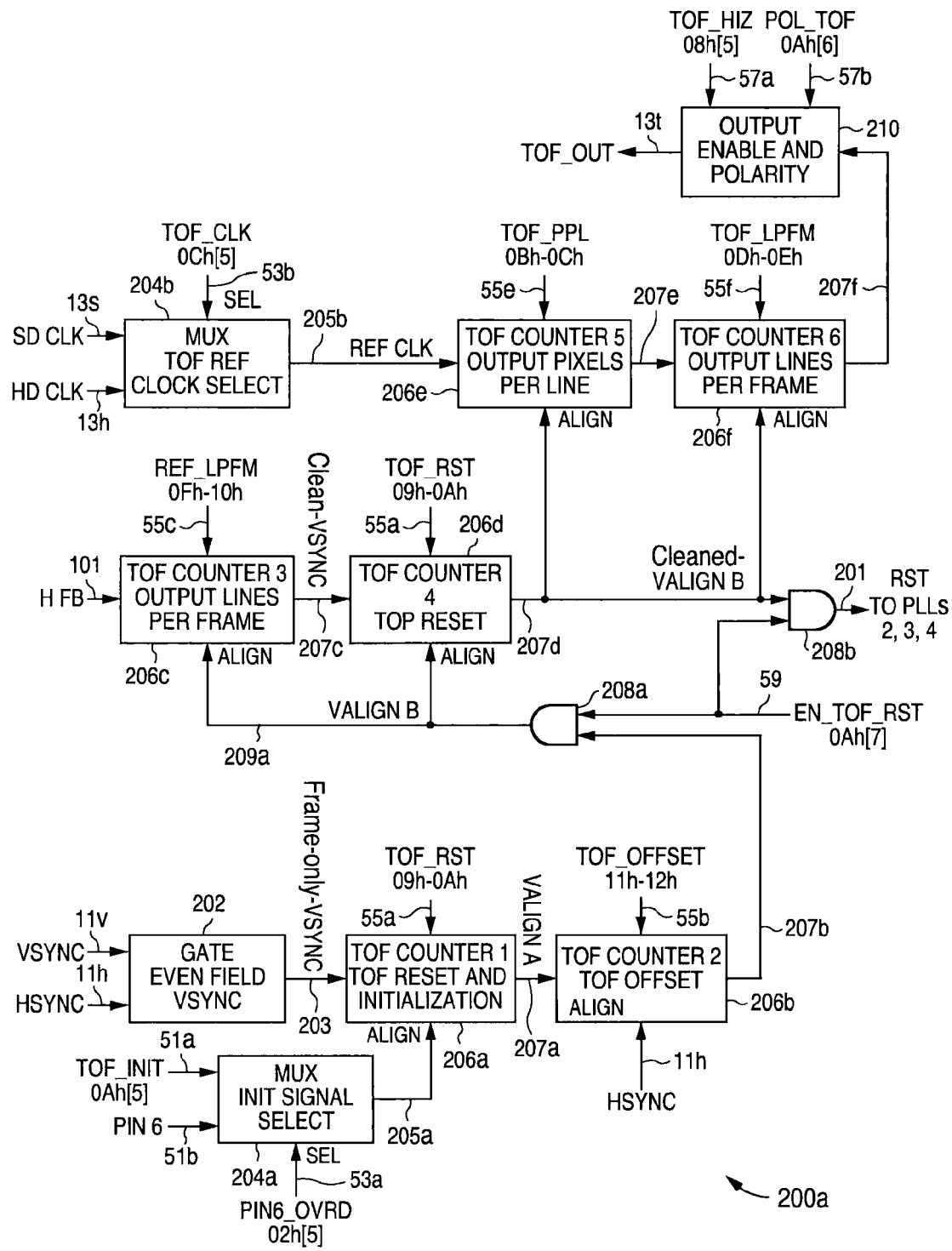
FIG. 4 is a functional block diagram of one example embodiment of the top-of-frame generator of FIG. 2.

Referring to FIG. 4, one example embodiment 200a of the TOF generator 200 (FIG. 2) includes a gating circuit 202, multiplexors 204a, 204b, counter/shifter circuits 206a, 206b, 206c, 206d, 206e, 206f, logic AND gates 208a, 208b, and output enable and polarity control circuitry 210, interconnected substantially as shown. Monitoring the horizontal 11h and vertical 11v synchronization signals, the gating circuit 202 removes the portion of the vertical synchronization signal 11v corresponding to the even field (field 2) for interlaced video formats, thereby ensuring that only that portion of the vertical synchronization signal 11v corresponding to the odd field (field 1) remains so as to properly identify the beginning, i.e., top, of the video frame.

The resulting gated signal 203 is counted down in the first counter 206a, in accordance with programmable count data 55a. This counter 206a is reset by the multiplexed signal 205a from the multiplexor 204a. Generally, an initialization signal 51a is selected as the multiplexed signal 205a to ensure that the ultimate TOF 13t in phase with the desired input reference frame. However, the multiplexor control signal 53a allows an off-chip signal 51b to be used as desired.

The first counter output 207a is shifted by the second counter 206b in accordance with programmable offset data 55b, with the resulting output signal 207b reset by the horizontal synchronization signal 11h. This programmable counter data 55b represents the line of the reference frame to which it is desired that the TOF signal 13t be aligned. This second counter output signal 207b, passed by the logic gate 208a when enabled by a control signal 59, serves as the reset signal 209a for the third 206c and fourth 206d counters.

The third counter 206c is clocked by the feedback signal 101 from the master PLL 102 (FIG. 3). In accordance with programmable count data 55c, this clock signal 101 is divided down to produce a clean vertical synchronization signal 207c. This programmable counter data 55c represents the reference frame timing and corresponds to the total number of reference lines per frame. The resultant signal 207c, in turn, in accordance with the programmable counter data 55a also used by the first counter 206a, is counted down by the fourth counter 206d to ensure its alignment with its reset signal 209a.

This programmable counter data 55a for the first and fourth counters 206a, 206d corresponds to the numerator of the ratio of the input frame rate to the output frame rate, with the numerator and denominator reduced to their lowest integer factors. For example, if the input frame rate is 29.97 hertz and the desired output frame rate is 23.976 hertz, then the programmable counter data 55a has a value of five. Accordingly, when the counter input signals, 203, 207c are counted down by this factor of five, it produces five signal phases, one of which is selected by the reset signals 205a, 209a.

The resultant signal 207d serves as the reset signal for the fifth and sixth counters 206e, 206f, and is provided, via logic gate 208b when enabled by the control signal 59, as the reset signal 201 for the slave PLL circuits 104a, 104b, 104c (FIG. 3).

The TOF output signal 13t is derived from a pixel line counter 206e and frame counter 206f, and ultimately synchronized to one of the selected pixel clocks 13s, 13h, depending upon the desired output timing format. Accordingly, the appropriate pixel clock 13s, 13h is selected by the second multiplexor 204b in accordance with programmed selection data 53b.

The resulting reference pixel clock 205b is counted successively by the fifth and sixth counters 206e, 206f in accordance with programmable counter data 55e, 55f. As discussed above, the multiplexor control data 53b specifies the top-of-frame clock frequency. The control data 55e for the pixel counter 206e corresponds to the total output pixel clocks per line. The control data 55f for the frame counter 206f corresponds to the total output lines per frame. Accordingly, the frame rate for the TOF output signal 13t is the quotient of the output pixel clock frequency divided by the product of the total pixels per line and total lines per frame. For example, when the output format is 625i (625 lines interlaced) the frequency of the clock signal is 27 megahertz (standard definition clock), the total number of pixel clocks per line is 1728, and the total number of lines per frame is 625. Accordingly, the frame rate for the TOF output signal 13t equals 27,000,000/(1728*625)=25 hertz.

The resulting count signal 207f is provided as the TOF output signal 13t in accordance with control signals 57a, 57b. One control signal 57a determines whether the count signal 207f is passed through to become the TOF output signal 13t, or if the output signal 13t is disabled and set in a high impedance state. The outer control signal 57b establishes the TOF output signal 13t polarity, i.e., as an active high or an active low signal.

Figure 5A:
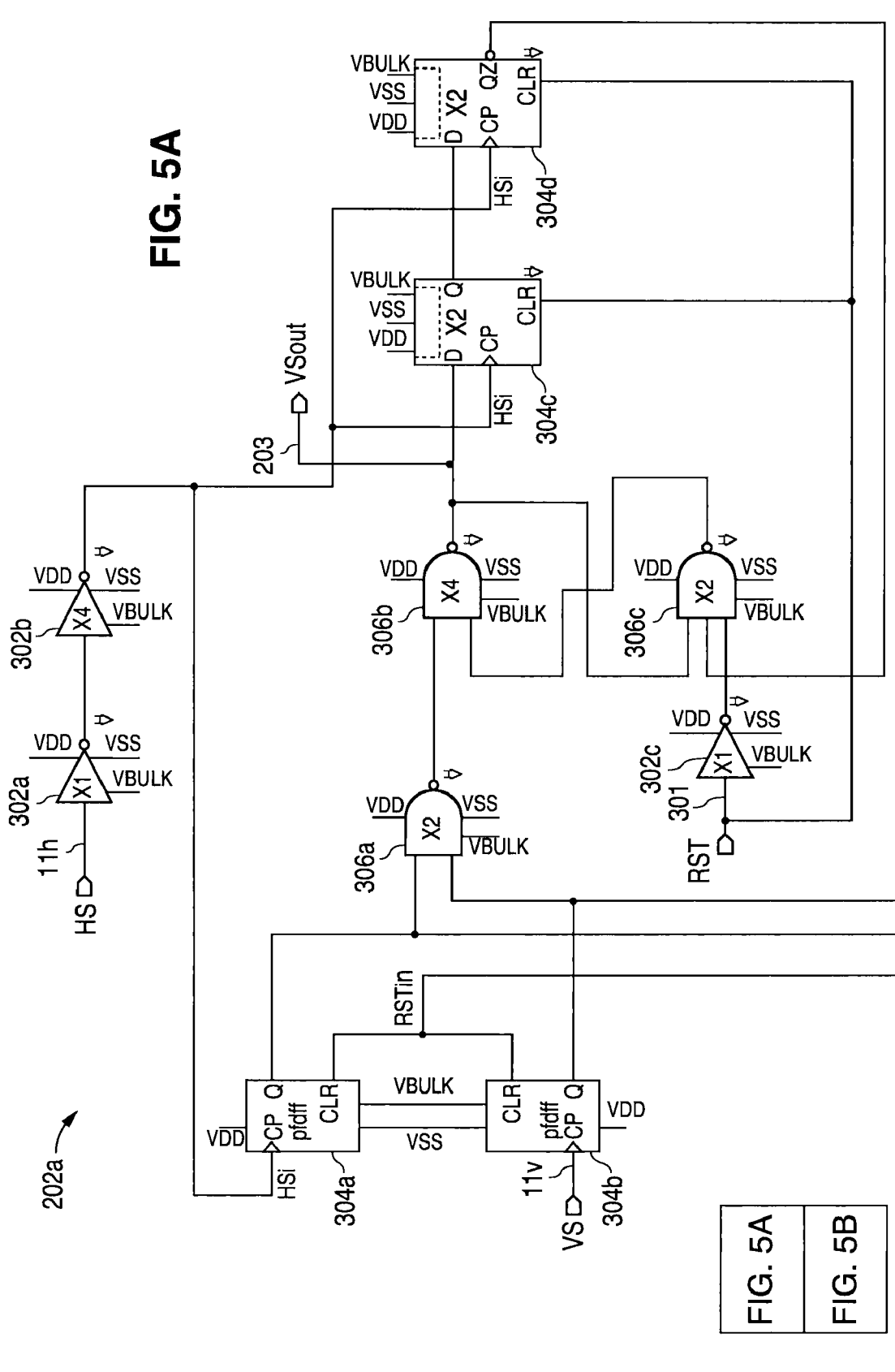
FIG. 5 is a logic diagram of one example embodiment of the field gating circuitry of FIG. 4.
Figure 5B:
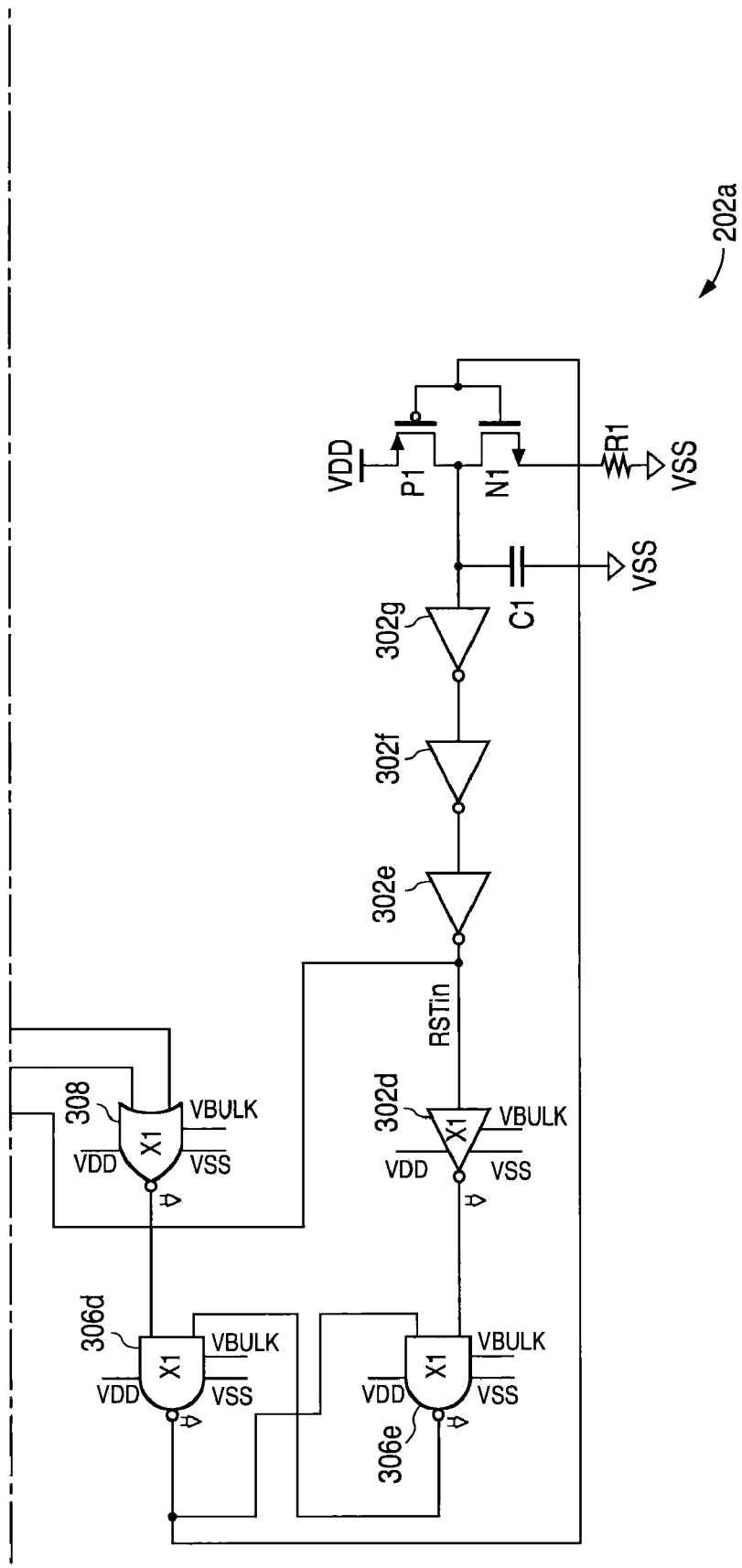

Referring to FIG. 5, one example embodiment 202a of the input gating signal 202 can be implemented using logic inverters 302a, 302b, 302c, 302d, 302e, 302f, 302g, D-type flip-flops 304a, 304b, 304c, 304d, logic NAND gates 306a, 306b, 306c, 306d, 306e, a logic NOR gate 308, complementary metal oxide semiconductor field effect transistors P1, N1, a resistance R1, and a capacitance C1, interconnected substantially as shown. As discussed above, this gating circuit 202a removes the vertical synchronization signal 11v information for the even field. This is done by monitoring the leading edges of the vertical 11v and horizontal 11h synchronization signals. If a leading edge of the vertical synchronization signal 11v is not within a prescribed time interval (e.g., 450 nanoseconds) either preceding or following a leading edge of the horizontal synchronization signal 11h, that portion of the vertical synchronization signal 11v is blocked, i.e., gated, out.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including integrated video clock signal generator circuitry, comprising:
   a first electrode to convey an off-chip control signal for off-chip voltage-controlled oscillator (VCO) circuitry;
   a second electrode to convey an off-chip VCO signal from said off-chip VCO circuitry;
   master phase detection circuitry coupled to said first and second electrodes and responsive to a horizontal reference signal and said off-chip VCO signal by providing said off-chip control signal, wherein said horizontal reference signal is related to a horizontal video synchronization signal, and said off-chip VCO signal is synchronized with said horizontal reference signal; and
   slave phase-locked loop (PLL) circuitry coupled to said second electrode and responsive to said off-chip VCO signal by providing one or more on-chip PLL signals, wherein each of said one or more on-chip PLL signals is synchronized with said off-chip VCO signal.

2. The apparatus of claim 1, wherein:
   said one or more on-chip PLL signals comprise respective one or more pixel clock signals;
   said slave PLL circuitry is further responsive to a vertical reference signal;
   said vertical reference signal is related to a vertical video synchronization signal; and
   each of said one or more pixel clock signals includes a respective plurality of clock signal pulses which is synchronized with said vertical reference signal.

3. The apparatus of claim 1, wherein said master phase detection circuitry comprises:
   phase-frequency detection circuitry responsive to said horizontal reference signal and a feedback signal by providing said off-chip control signal; and
   frequency division circuitry responsive to said off-chip VCO signal by providing said feedback signal, wherein said off-chip VCO signal and said feedback signal have higher and lower signal frequencies, respectively.

4. The apparatus of claim 1, wherein said slave PLL circuitry comprises:
   slave phase detection circuitry responsive to said off-chip VCO signal and said one or more on-chip PLL signals by providing one or more on-chip control signals; and
   slave VCO circuitry coupled to said slave phase detection circuitry and responsive to said one or more on-chip control signals by providing said one or more on-chip PLL signals.

5. The apparatus of claim 4, wherein said slave phase detection circuitry comprises:
   phase-frequency detection circuitry responsive to said off-chip VCO signal and one or more feedback signals by providing said one or more on-chip control signals; and
   frequency division circuitry responsive to said one or more on-chip PLL signals by providing said one or more feedback signals, wherein each of said one or more on-chip PLL signals and a related one of said one or more feedback signals have higher and lower signal frequencies, respectively.

6. The apparatus of claim 4, wherein said slave VCO circuitry comprises one or more resonant tank circuits.

7. The apparatus of claim 6, wherein each of said one or more resonant tank circuits comprises:
   integrated inductive circuitry; and
   integrated capacitive circuitry.

8. The apparatus of claim 1, wherein said slave PLL circuitry comprises:
   slave phase detection circuitry responsive to said off-chip VCO signal and one or more on-chip VCO signals by providing one or more on-chip control signals;
   slave VCO circuitry coupled to said slave phase detection circuitry and responsive to said one or more on-chip control signals by providing said one or more on-chip VCO signals; and
   synchronization circuitry coupled to said slave VCO circuitry and responsive to a vertical reference signal and said one or more on-chip VCO signals by providing respective one or more pixel clock signals, wherein said vertical reference signal is related to a vertical video synchronization signal, and each of said one or more pixel clock signals includes a respective plurality of clock signal pulses which is synchronized with said vertical reference signal.

9. The apparatus of claim 8, wherein said slave phase detection circuitry comprises:
   phase-frequency detection circuitry responsive to said off-chip VCO signal and one or more feedback signals by providing said one or more on-chip control signals; and
   frequency division circuitry responsive to said one or more on-chip VCO signals by providing said one or more feedback signals, wherein each of said one or more on-chip VCO signals and a related one of said one or more feedback signals have higher and lower signal frequencies, respectively.

10. The apparatus of claim 8, wherein said slave VCO circuitry comprises one or more resonant tank circuits.

11. The apparatus of claim 10, wherein each of said one or more resonant tank circuits comprises:
    integrated inductive circuitry; and
    integrated capacitive circuitry.

12. An apparatus including integrated video clock signal generator circuitry, comprising:
    master phase detector means for receiving a horizontal reference signal and an off-chip voltage-controlled oscillator (VCO) signal from off-chip VCO circuitry, and in response thereto providing an off-chip control signal for said off-chip VCO circuitry, wherein said horizontal reference signal is related to a horizontal video synchronization signal, and said off-chip VCO signal is synchronized with said horizontal reference signal; and slave phase-locked loop (PLL) means for receiving said off-chip VCO signal and in response thereto providing one or more on-chip PLL signals, wherein each of said one or more on-chip PLL signals is synchronized with said off-chip VCO signal.

13. The apparatus of claim 12, wherein said slave PLL means is further for receiving a vertical reference signal related to a vertical video synchronization signal and in response thereto providing said one or more on-chip PLL signals as respective one or more pixel clock signals, wherein each of said one or more pixel clock signals includes a respective plurality of clock signal pulses which is synchronized with said vertical reference signal.

14. A method for generating one or more video clock signals with an integrated circuit, comprising:

receiving, on-chip, a horizontal reference signal and an off-chip voltage-controlled oscillator (VCO) signal from off-chip VCO circuitry, and in response thereto providing an off-chip control signal for said off-chip VCO circuitry, wherein said horizontal reference signal is related to a horizontal video synchronization signal, and said off-chip VCO signal is synchronized with said horizontal reference signal; and receiving, on-chip, said off-chip VCO signal and in response thereto providing one or more on-chip PLL signals, wherein each of said one or more on-chip PLL signals is synchronized with said off-chip VCO signal.

15. The method of claim 14, further comprising receiving a vertical reference signal related to a vertical video synchronization signal and in response thereto providing said one or more on-chip PLL signals as respective one or more pixel clock signals, wherein each of said one or more pixel clock signals includes a respective plurality of clock signal pulses which is synchronized with said vertical reference signal.

* * * * *